(12) United States Patent
Honda et al.

(10) Patent No.: US 8,890,565 B2
(45) Date of Patent: Nov. 18, 2014

(54) LOGIC SIGNAL TRANSMISSION CIRCUIT WITH ISOLATION BARRIER

(71) Applicant: DENSO CORPORATION, Kariya (JP)

(72) Inventors: Kazutaka Honda, Chiryu (JP); Tetsuya Makihara, Nukata-gun (JP)

(73) Assignee: DENSO CORPORATION, Kariya (JP)

(\*) Notice: Subject to any disclaimer, the term of this patent is extended or adjusted under 35 U.S.C. 154(b) by 155 days.

(21) Appl. No.: 13/761,533

(22) Filed: Feb. 7, 2013

(65) Prior Publication Data

US 2013/0207687 A1    Aug. 15, 2013

(30) Foreign Application Priority Data

Feb. 10, 2012    (JP) .................................. 2012-27141

(51) Int. Cl.
*H03K 19/0175*    (2006.01)
*H03K 19/00*      (2006.01)
*H04L 25/02*      (2006.01)
*H03K 19/0185*    (2006.01)

(52) U.S. Cl.
CPC .................. *H03K 19/017545* (2013.01); *H03K 19/018521* (2013.01); *H01L 2224/48137* (2013.01)
USPC ................. 326/30; 326/82; 327/415; 327/77; 327/215

(58) Field of Classification Search
USPC .......... 326/30, 31, 82, 26; 327/415, 199, 215, 327/77
See application file for complete search history.

(56) References Cited

U.S. PATENT DOCUMENTS

| 4,678,939 | A |   | 7/1987  | Laue |
|-----------|---|---|---------|------|
| 4,748,419 | A |   | 5/1988  | Somerville |
| 5,635,864 | A | * | 6/1997  | Jones .............................. 327/77 |
| 5,959,469 | A | * | 9/1999  | Kurauchi et al. ............... 327/77 |
| 6,124,756 | A |   | 9/2000  | Yaklin et al. |
| 6,144,232 | A | * | 11/2000 | Yukawa et al. ................. 327/77 |
| 6,525,566 | B2 |  | 2/2003  | Haigh et al. |
| 6,608,503 | B2 | * | 8/2003 | Shenai et al. ................... 327/77 |
| 7,755,400 | B2 |  | 7/2010  | Jordanger et al. |
| 2003/0038656 | A1 | * | 2/2003 | Shenai et al. ................... 327/77 |

FOREIGN PATENT DOCUMENTS

JP    11-136293 A    5/1999

OTHER PUBLICATIONS

Office Action mailed Feb. 4, 2014 issued in corresponding JP patent application No. 2012-027141 (and English translation).

\* cited by examiner

*Primary Examiner* — Daniel D Chang
(74) *Attorney, Agent, or Firm* — Posz Law Group, PLC

(57) ABSTRACT

A logic signal transmission circuit includes a driving circuit, an isolation section, and a latch section. The driving circuit converts an input digital signal to a differential digital signal. The isolation section blocks direct current and passes the differential digital signal. The latch section has even numbers of inverters which are connected in a loop and output a logic signal by turning ON and OFF a power supply voltage in a complementary manner. An input impedance of the latch section is set so that when a logic level of the differential digital signal changes, a transient voltage inputted through the isolation section to the latch section changes across a threshold voltage of the latch section. When the transient voltage changes across the threshold voltage, a logic level of the logic signal changes.

15 Claims, 12 Drawing Sheets

VIN

OUTPUT OF 2a

OUTPUT OF 2b

OUTPUT OF 3a

OUTPUT OF 3b

OUTPUT OF 4a

OUTPUT OF 4b

FIG. 7A
INPUT OF 3a
FIG. 7B
INPUT OF 3b
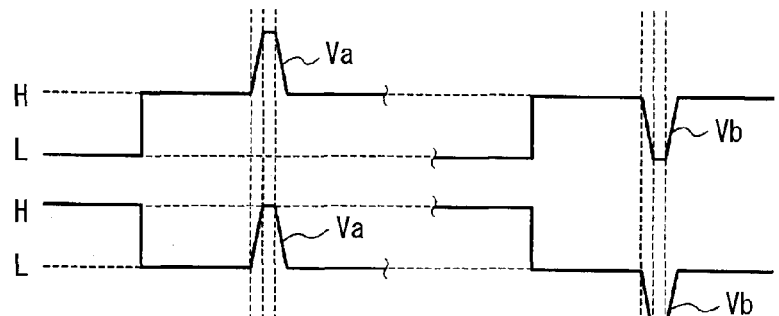
FIG. 7C
INPUT OF 4a
FIG. 7D
INPUT OF 4b
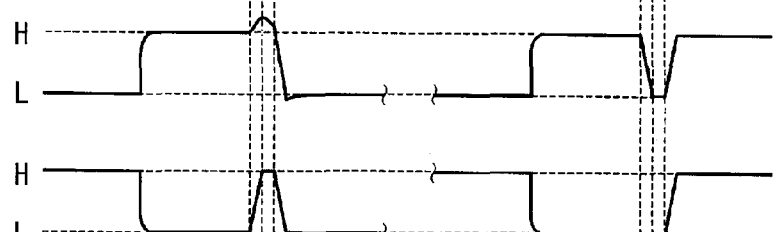
FIG. 7E
OUTPUT OF 4a
FIG. 7F
OUTPUT OF 4b
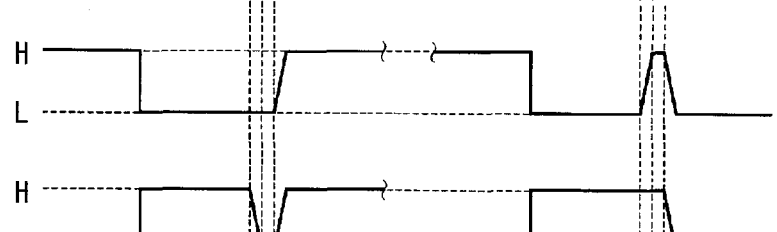
FIG. 7G
OUTPUT OF 6ab
FIG. 7H
OUTPUT OF 6bb
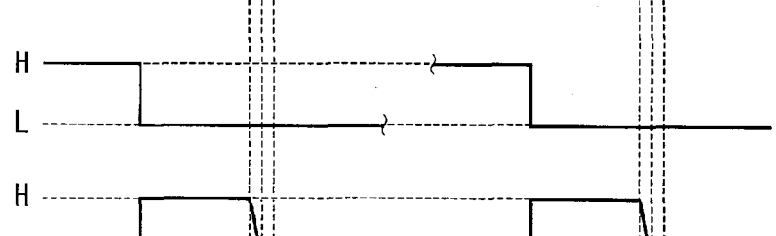
FIG. 7I
OUT3
FIG. 7J
OUT3B
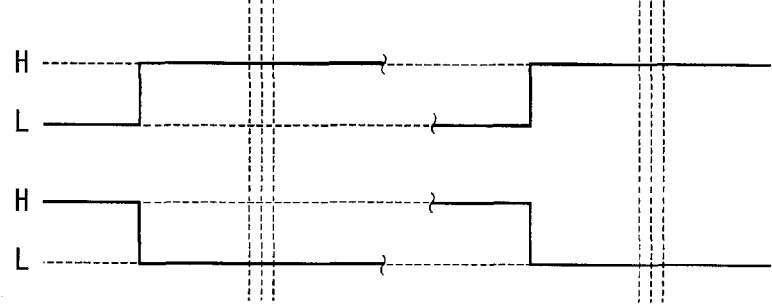

US 8,890,565 B2

LOGIC SIGNAL TRANSMISSION CIRCUIT WITH ISOLATION BARRIER

CROSS REFERENCE TO RELATED APPLICATION

This application is based on Japanese Patent Application No. 2012-27141 filed on Feb. 10, 2012, the contents of which are incorporated herein by reference.

FIELD

The present disclosure relates to a circuit for transmitting a logic signal through an isolation barrier.

BACKGROUND

U.S. Pat. No. 7,755,400, U.S. Pat. No. 4,748,419, and U.S. Pat. No. 4,678,939 disclose a circuit for transmitting a logic signal by using a capacitive isolator as an isolation barrier. The capacitive isolator uses a pair of capacitors to block direct current (DC) between an input side and an output side. For example, in U.S. Pat. No. 7,755,400, the output side is constructed with a high-pass filter (HPF) for edge detection, a window comparator, a reference voltage generator for outputting a DC bias, and a power supply circuit for the comparator, and a RS flip-flop.

The conventional circuit consumes a large amount of power, because a constant bias is necessary for the window comparator, the reference voltage generator, and the power supply circuit.

SUMMARY

In view of the above, it is an object of the present disclosure to reduce power consumption in a logic signal transmission circuit which has an isolation barrier.

According to an aspect of the present disclosure, a logic signal transmission circuit includes a driving circuit, an isolation section, and a latch section. The driving circuit converts an input digital signal to a differential digital signal having a first digital signal and a second digital signal. The isolation section blocks direct current and passes the differential digital signal. The isolation section includes a first isolation barrier and a second isolation barrier. The first isolation barrier passes the first digital signal. The second isolation barrier passes the second digital signal. The latch section includes a first latch circuit connected to an output terminal of the first isolation barrier and a second latch circuit connected to an output terminal of the second isolation barrier. The first latch circuit has even numbers of first inverters which are connected in a loop and output a first logic signal by turning ON and OFF a power supply voltage in a complementary manner. A first input impedance of the first latch circuit is set so that when a logic level of the first digital signal changes, a first transient voltage inputted through the first isolation barrier to the first latch circuit changes across a first threshold voltage of the first latch circuit. When the first transient voltage changes across the first threshold voltage, a logic level of the first logic signal changes. The second latch circuit has even numbers of second inverters which are connected in a loop and outputs a second logic signal by turning ON and OFF a power supply voltage in a complementary manner. A second input impedance of the second latch circuit is set so that when a logic level of the second digital signal changes, a second transient voltage inputted through the second isolation barrier to the second latch circuit changes across a second threshold of the second latch circuit. When the second transient voltage changes across the second threshold voltage, a logic level of the second logic signal changes.

BRIEF DESCRIPTION OF THE DRAWINGS

The above and other objects, features and advantages of the present disclosure will become more apparent from the following detailed description made with reference to the accompanying drawings. In the drawings:

FIGS. 7A, 7B, 7C, 7D, 7E, 7F, 7G, 7H, 7I, and 7J are timing charts showing changes in voltages of the logic signal transmission circuit of FIG. 6;

DETAILED DESCRIPTION

First Embodiment

Figure 1:
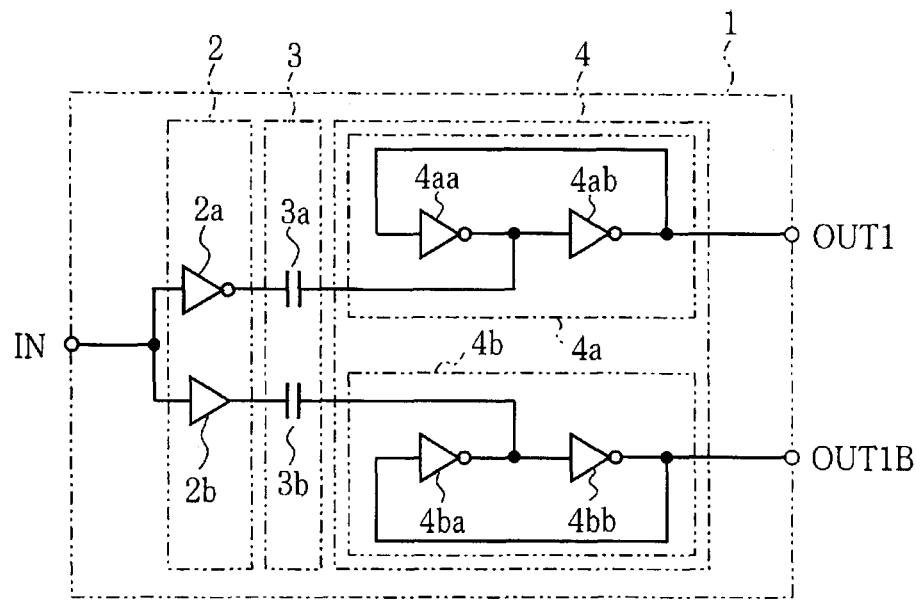
FIG. 1 is a diagram illustrating a logic signal transmission circuit according to a first embodiment of the present disclosure.

A logic signal transmission circuit 1 according to a first embodiment of the present disclosure is described below with reference to FIG. 1, FIG. 2, FIGS. 3A-3G, and FIGS. 4A-4C. The transmission circuit 1 includes a driving circuit 2, an isolation section 3, and a latch section 4. The driving circuit 2 includes an inverting buffer 2a and a non-inverting buffer 2b. An input of the inverting buffer 2a is connected to an input of the non-inverting buffer 2b. The driving circuit 2 converts an input digital signal VIN, which is inputted to an input terminal IN of the logic signal transmission circuit 1, to a differential digital signal pair having a first digital signal and a second digital signal.

The isolation section 3 includes a pair of high-voltage capacitors 3a and 3b. Each of the capacitors 3a and 3b has the same structure and the same capacitance. For example, the capacitance of each of the capacitors 3a and 3b can range from one-tenth of several picofarads (pF) to several picofarads (pF). The driving circuit 2 on the input side of the isolation section 3 performs a logic operate at a direct-current (DC) potential around 650 volts (for example, from 645 volts to 650 volts). In contrast, a circuit on the output side of the isolation section 3 performs a logic operation at a DC potential around 0 volts (for example, from 0 volts to 5 volts). That is, each of the capacitors 3a and 3b blocks direct current and shifts a voltage level.

The latch section 4 includes a pair of latch circuits 4a and 4b. The latch circuit 4a is connected to the capacitor 3a. The latch circuit 4b is connected to the capacitor 3b. Each of the latch circuits 4a and 4b has the same structure. Although the following explanation refers to only the latch circuit 4a, the latch circuit 4b is configured in the same manner as the latch circuit 4a.

Figure 2:
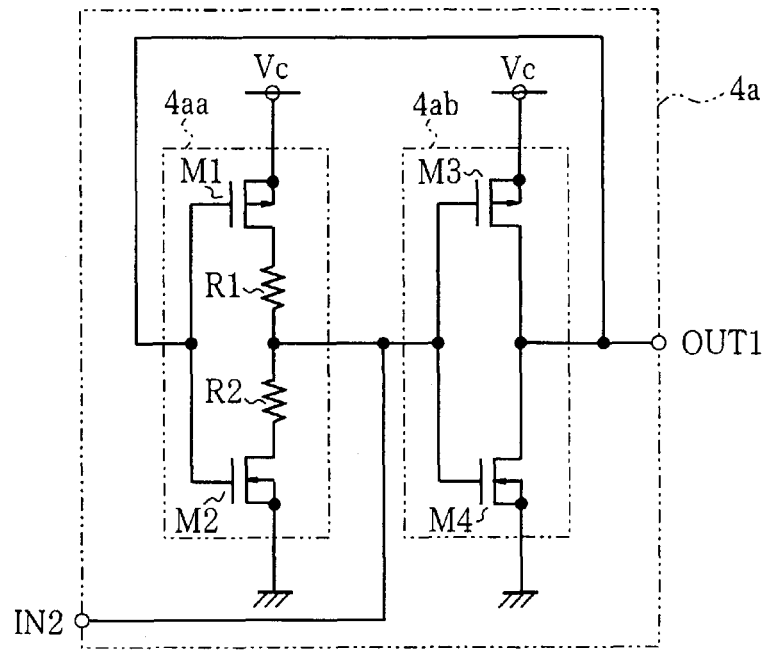
FIG. 2 is a diagram illustrating a detail view of a latch circuit of the logic signal transmission circuit of FIG. 1.

The latch circuit 4a has even numbers of inverters (i.e., NOT-gate) connected in a loop. According to the first embodiment, the latch circuit 4a has two inverters 4aa and 4ab. As shown in FIG. 2, the first-stage inverter 4aa includes a P-channel MOS transistor M1, a resistor R1, a resistor R2, and an N-channel MOS transistor M2. The MOS transistor M1, the resistor R1, the resistor R2, and the MOS transistor M2 are connected in series between a power terminal for supplying a power supply voltage Vc and a ground potential. The gate of the MOS transistor M1 is connected to the gate of the MOS transistor M2. For example, each of the resistors R1 and R2 can have a resistance of from about several hundred ohms (Ω) to about several kilo-ohms (kΩ).

The second-stage inverter 4ab includes a P-channel MOS transistor M3 and an N-channel MOS transistor M4. The MOS transistor M3 and the MOS transistor M4 are connected in series between a power terminal for supplying the power supply voltage Vc and a ground potential. The gate of the MOS transistor M3 is connected to the gate of the MOS transistor M4.

An input terminal IN2 of the latch circuit 4a is connected to a node (i.e., a connection point) between the resistors R1 and R2. Further, the input terminal IN2 is connected to a node between the gates of the MOS transistors M3 and M4. An output terminal OUT1 of the latch circuit 4a is connected to a node between the drains of the MOS transistors M3 and M4. Further, the output terminal OUT1 is connected to a node between the gates of the MOS transistors M1 and M2.

When a logic-high level signal is inputted to the input terminal IN2 of the latch circuit 4a, the MOS transistor M3 is turned OFF, and the MOS transistor M4 is turned ON. As a result, the output terminal OUT1 outputs a logic-low level signal. When the output terminal OUT1 outputs the logic-low level signal, the MOS transistor M1 is turned ON, and the MOS transistor M2 is turned OFF.

At this time, an input impedance of the gate of each of the MOS transistors M3 and M4 can be infinite. Therefore, when an ON-resistance of each of the MOS transistors M1 and M2 is much smaller than a resistance of each of the resistors R1 and R2, an input impedance of the input terminal IN2 of the latch circuit 4a becomes almost equal to a combined series resistance of the ON-resistance of the MOS transistor M1 and the resistance of the resistor R1. In this case, the combined series resistance of the ON-resistance of the MOS transistor M1 and the resistance of the resistor R1 is almost equal to the resistance of the resistor R1.

In contrast, when a logic-low level signal is inputted to the input terminal IN2 of the latch circuit 4a, the MOS transistor M3 is turned ON, and the MOS transistor M4 is turned OFF. As a result, the output terminal OUT1 outputs a logic-high level signal. When the output terminal OUT1 outputs the logic-high level signal, the MOS transistor M1 is turned OFF, and the MOS transistor M2 is turned ON.

At this time, the input impedance of the input terminal IN2 of the latch circuit 4a becomes almost equal to a combined series resistance of the ON-resistance of the MOS transistor M2 and the resistance of the resistor R2. In this case, the combined series resistance of the ON-resistance of the MOS transistor M2 and the resistance of the resistor R2 is almost equal to the resistance of the resistor R2.

An electrical transient phenomena in the logic signal transmission circuit 1 is described below with reference to FIGS. 3A-3G and FIGS. 4A-4C.

Figure 3A:
FIGS. 3A, 3B, 3C, 3D, 3E, 3F, and 3G are timing charts showing changes in voltages of the logic signal transmission circuit of FIG. 1.
Figure 3B:
Figure 3C:
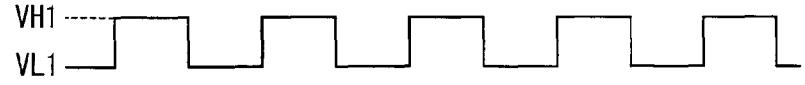
Figure 3D:
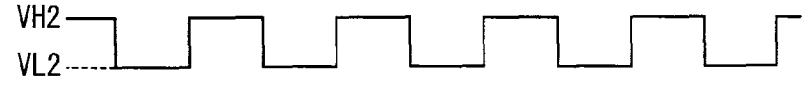
Figure 3E:
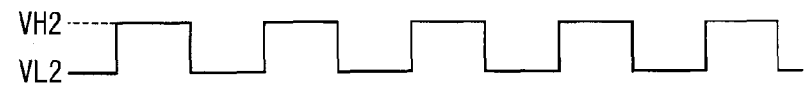
Figure 3F:
Figure 3G:

FIG. 3A illustrates a voltage waveform of the input digital signal VIN. FIG. 3B illustrates a voltage waveform of an output signal of the inverting buffer 2a. FIG. 3C illustrates a voltage waveform of an output signal of the non-inverting buffer 2b. FIG. 3D illustrates a voltage waveform of an output signal of the capacitor 3a. FIG. 3E illustrates a voltage waveform of an output signal of the capacitor 3b. FIG. 3F illustrates a voltage waveform of an output signal of the latch circuit 4a. FIG. 3G illustrates a voltage waveform of an output signal of the latch circuit 4b. The driving circuit 2 performs a logic operation at a DC potential around 650 volts, for example. The inverting buffer 2a outputs a digital signal in a range between a voltage VH1 and a voltage VL1 by logically inverting the input digital signal VIN. For example, the voltage VH1 is 650 volts, and the voltage VL1 is 645 volts. In contrast, the non-inverting buffer 2b outputs a digital signal in the range between the voltage VH1 and the voltage VL1 by buffering the input digital signal VIN.

The capacitor 3a blocks direct current. Therefore, the digital signal outputted from the inverting buffer 2a is outputted from the capacitor 3a in a range between a voltage VH2 and a voltage VL2. For example, the voltage VH2 is 5 volts, and the voltage VL2 is 0 volts. Likewise, the capacitor 3b blocks direct current. Therefore, the digital signal outputted from the non-inverting buffer 2b is outputted from the capacitor 3b in the range between the voltage VH2 and the voltage VL2.

The latch circuit 4a logically inverts and holds the digital signal outputted through the capacitor 3a from the inverting buffer 2a. Thus, when the digital signal outputted from the inverting buffer 2a changes, the digital signal held by the latch circuit 4a changes accordingly. Likewise, the latch circuit 4b logically inverts and holds the digital signal outputted through the capacitor 3b from the non-inverting buffer 2b. Thus, when the digital signal outputted from the non-inverting buffer 2b changes, the digital signal held by the latch circuit 4b changes accordingly.

Figure 4A:
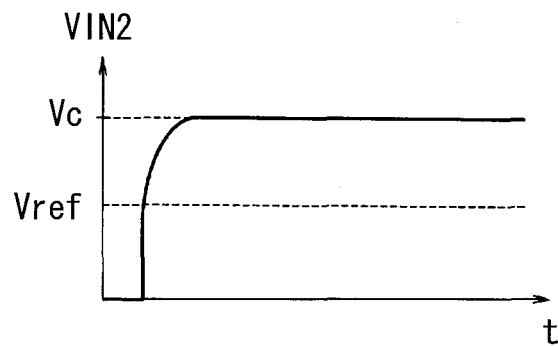
FIG. 4A is a diagram illustrating a transient characteristic of an input voltage to the latch circuit when the input voltage changes across a threshold voltage of the latch circuit.
Figure 4B:
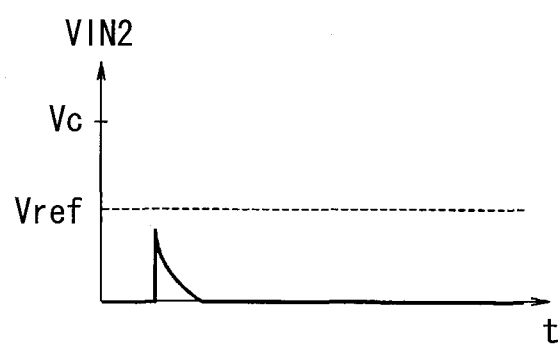
FIG. 4B is a diagram illustrating a transient characteristic of the input voltage when the input voltage does not change across the threshold voltage.

FIGS. 4A and 4B illustrate changes in an input voltage VIN2 of the input terminal IN2 of the latch circuit 4a. For example, a threshold voltage Vref of the latch circuit 4a can be set to a half of the power supply voltage Vc (i.e., Vref=Vc/2).

For example, as shown in FIG. 4A, when the input voltage VIN2 of the input terminal IN2 of the latch circuit 4a increases above the threshold voltage Vref under a condition that the logic level of the input terminal IN2 remains low, the logic level of the input terminal IN2 changes to high due to a positive feedback of the latch circuit 4a.

For example, as shown in 4B, when a voltage lower than the threshold voltage Vref is applied to the input terminal IN2 due to noise under the condition that the logic level of the input terminal IN2 remains low, an electric current flows through the resistor R1 or the resistor R2. Accordingly, the voltage varying with the noise gradually decreases so that the input voltage VIN2 of the input terminal IN2 can return to a reference voltage (e.g., 0 volts) of the logic-low level. Therefore, the logic level of the input terminal IN2 remains unchanged so that the logic level held by the latch circuit 4a can remain unchanged.

The noise immunity of the logic signal transmission circuit 1 can be suitably ensured by adjusting a time constant τ (=C·Zin) of a high-pass filter (HPF) which is constructed with a capacitance C of the capacitor 3a and an input impedance Zin of the input terminal IN2 of the latch circuit 4a. Therefore, it is preferable that a combined resistance of the ON resistances of the MOS transistors M1 and M2 and the resistances of the resistors R1 and R2 should be determined according to the capacitance C of the capacitor 3a.

The input impedance Zin depends on the combined resistance of the ON resistances of the MOS transistors M1 and M2 and the resistances of the resistors R1 and R2. It is noted that the resistors R1 and R2 can be omitted from the latch circuit 4a. When the resistors R1 and R2 are omitted, the input impedance Zin depends on the combined resistance of the ON resistances of the MOS transistors M1 and M2. The ON resistance of each of the MOS transistors M1 and M2 can be adjusted by adjusting the size (i.e., the length or width of the gate) of each of the MOS transistors M1 and M2. That is, the input impedance Zin can be adjusted by adjusting the sizes of the MOS transistors M1 and M2.

The above description is based on the assumption that the input voltage VIN2 of the latch circuit 4a increases from below to above the threshold voltage Vref so that the logic level of the input terminal IN2 of the latch circuit 4a can change from low to high. It is noted that when the input voltage VIN2 of the latch circuit 4a decreases from above to below the threshold voltage Vref, the logic level of the input terminal IN2 of the latch circuit 4a can change from high to low in the same manner as described above for when the input voltage VIN2 of the latch circuit 4a increases from below to above the threshold voltage Vref. Also, the latch circuit 4b operates in the same manner as the latch circuit 4a.

Figure 4C:
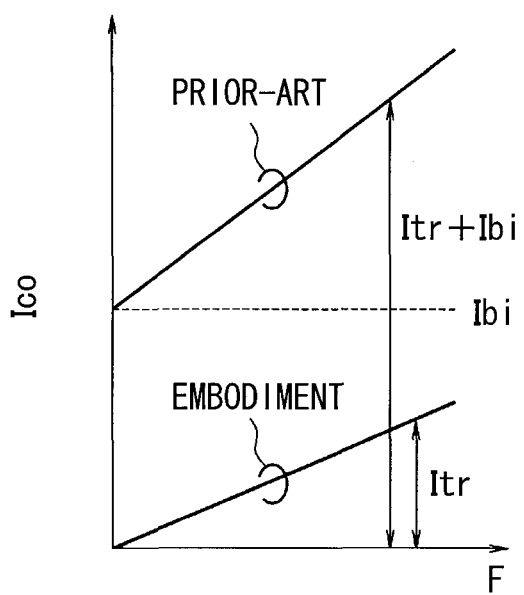
FIG. 4C is a diagram illustrating dependence of consumption current on operating frequency.

FIG. 4C illustrates a relationship between a consumption current Ico and an operating frequency F of each of the logic signal transmission circuit 1 according to the first embodiment and a prior-art circuit. As shown in FIG. 4C, in the prior-art circuit, not only a transient current Itr but also a constant current Ibi are consumed. In contrast, in the logic signal transmission circuit 1, only the transient current Itr is consumed, because the logic signal transmission circuit 1 does not have a structure which consumes the constant current Ibi (i.e., direct-current (dc) bias current). Therefore, the consumption current Ico is smaller in the logic signal transmission circuit 1 than in the prior-art circuit.

As described above, according to the first embodiment, the capacitor 3a blocks direct current component of the digital signal outputted from the driving circuit 2. The latch circuit 4a logically inverts and holds the digital signal outputted from the capacitor 3a. Since the latch circuit 4a is constructed with the MOS transistors M1-M4 which turn ON and OFF the power supply voltage Vc in a complementary manner, constant bias is not required.

The input impedance Zin of the latch circuit 4a is set in such a manner that the input voltage VIN2 of the latch circuit 4a changes across the threshold voltage Vref when the logic level of the digital signal outputted from the driving circuit 2 changes. Thus, the latch circuit 4a logically inverts and holds data. The noise immunity can be suitably ensured by adjusting the time constant τ (=C·Zin) of the high-pass filter which is constructed with the capacitance C of the capacitor 3a and the input impedance Zin of the input terminal IN2 of the latch circuit 4a.

The latch circuit 4a, which is connected to the output of the capacitor 3a, has the resistors R1 and R2. Therefore, the input impedance Zin can be adjusted by adjusting the resistances of the resistors R1 and R2.

When the input impedance Zin depends on internal resistances of the MOS transistors M1 and M2, the input impedance Zin can be adjusted by adjusting the sizes (i.e., the lengths or widths of the gates) of the MOS transistors M1 and M2.

Second Embodiment

A logic signal transmission circuit 110 according to a second embodiment of the present disclosure is described below with reference to FIG. 5. A difference between the first embodiment and the second embodiment is as follows.

Figure 5:
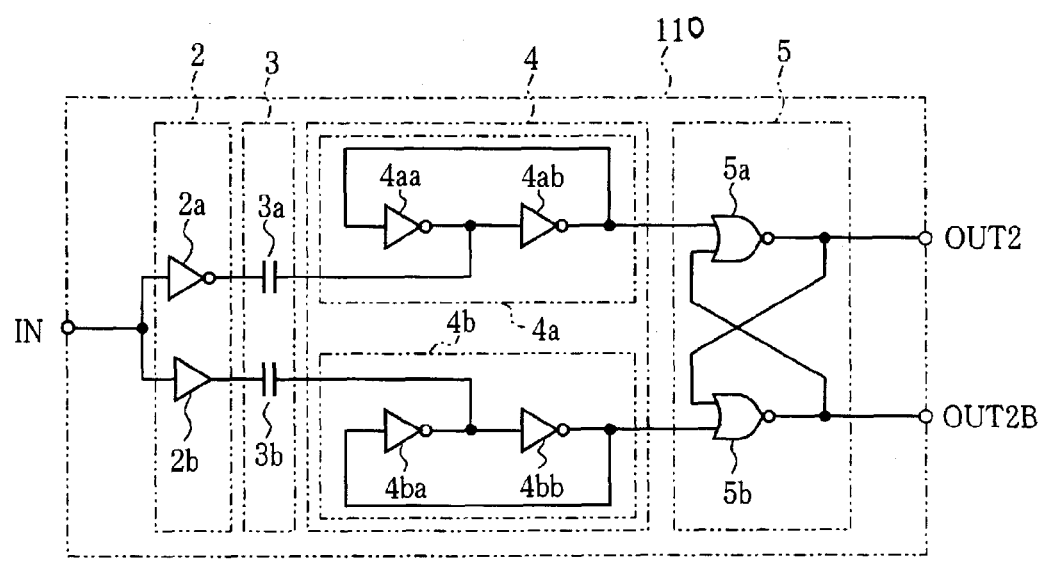
FIG. 5 is a diagram illustrating a logic signal transmission circuit according to a second embodiment of the present disclosure.

As shown in FIG. 5, the logic signal transmission circuit 110 includes an output holding section 5 in addition to the driving circuit 2, the isolation section 3, and the latch section 4. The output holding section 5 is connected to the output of the latch section 4. The output holding section 5 includes NOR gates 5a and 5b. The NOR gates 5a and 5b are connected to form a reset-set flip-flop (RS-FF). The output holding section 5 holds the digital signal outputted from the latch section 4. Thus, the digital signal held by the latch section 4 can be stably held.

Third Embodiment

A logic signal transmission circuit 120 according to a third embodiment of the present disclosure is described below with reference to FIGS. 6 and 7. A difference between the second embodiment and the third embodiment is as follows.

Figure 6:
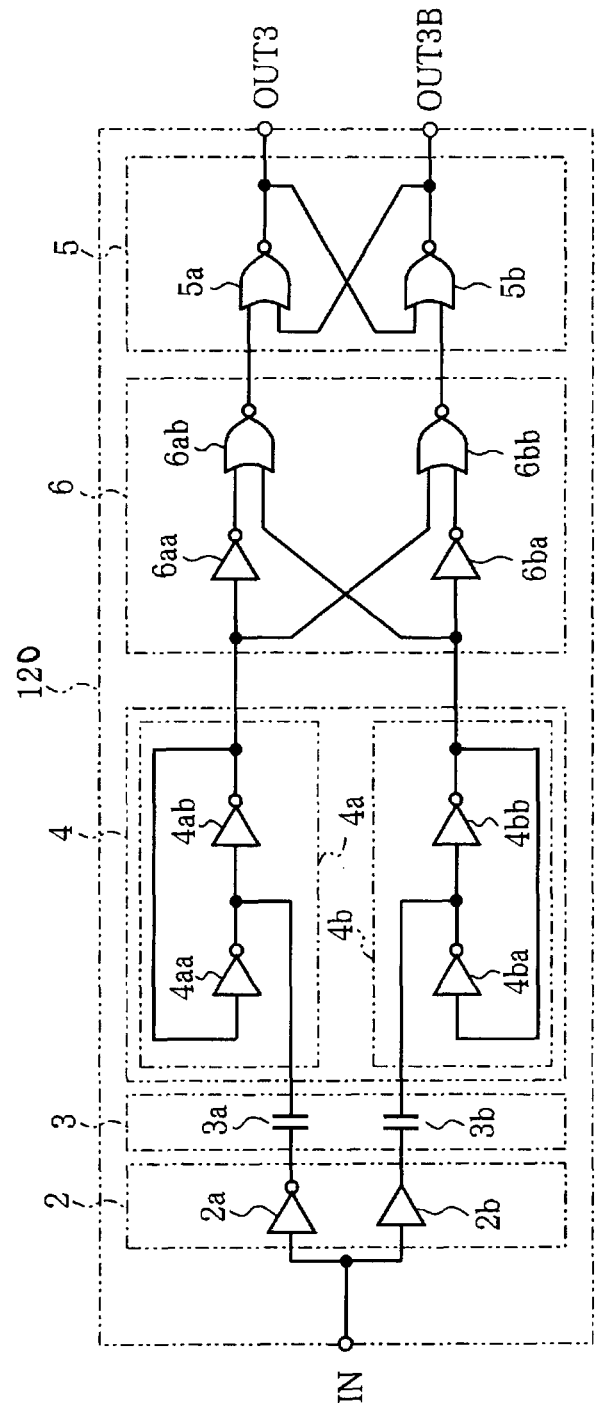
FIG. 6 is a diagram illustrating a logic signal transmission circuit according to a third embodiment of the present disclosure.

As shown in FIG. 6, the logic signal transmission circuit 120 includes a circuit 6 (as a first circuit) interposed between the latch section 4 and the output holding section 5. The circuit 6 includes a NOT gate 6aa, a NOR gate 6ab, a NOT gate 6ba, and a NOR gate 6bb. The circuit 6 serves to prevent a malfunction caused by common mode noise.

The output of the latch circuit 4a is inputted to the NOT gate 6aa, and an output of the NOT gate 6aa is inputted to the NOR gate 6ab. The output of the latch circuit 4b is inputted to the NOT gate 6ba, and an output of the NOT gate 6ba is inputted to the NOR gate 6bb. The output of the latch circuit 4a is inputted to the NOR gate 6bb, and the output of the latch circuit 4b is inputted to the NOR gate 6ab. An output of the NOR gate 6ab is inputted to the NOR gate 5a of the output holding section 5. An output of the NOR gate 6bb is inputted to the NOR gate 5b of the output holding section 5.

Here, it is assumed that a common mode positive pulse noise voltage Va is superimposed on the input digital signal VIN. For example, a peak-to-peak voltage of the noise voltage Va can be 42 volts. As shown in the left side of FIG. 7A, the noise voltage Va is inputted to the latch circuit 4a through the inverting buffer 2a and the capacitor 3a. Likewise, as shown in the left side of FIG. 7B, the noise voltage Va is inputted to the latch circuit 4b through the non-inverting buffer 2b and the capacitor 3b.

As shown in the left side of FIG. 7C, even when the noise voltage Va is inputted to the latch circuit 4a, the noise voltage Va is regenerated back to a power circuit of the latch circuit 4a and thus clamped. In contrast, as shown in the left side of FIG. 7D, the noise voltage Va inputted to the capacitor 3b appears directly at the input of the latch circuit 4b so that the logic level can change according to a change in the noise voltage Va.

As shown in the left side of FIG. 7E, the latch circuit 4a inverts and holds the logic signal inputted to the latch circuit 4a. Even when the noise voltage Va is superimposed, the noise voltage Va is clamped at the input terminal IN2 of the latch circuit 4a. Therefore, the logic level of the output of the latch circuit 4a remains unchanged at a timing of the rising edge of the noise voltage Va. Then, the logic level of the output of the latch circuit 4a changes from low to high at a timing of the falling edge of the noise voltage Va.

In contrast, as shown in the left side of FIG. 7F, the logic level of the output of the latch circuit 4b changes from high to low due to the function of the inverter 4bb at the timing of the rising edge of the noise voltage Va. Further, the logic level of the output of the latch circuit 4b changes from low to high due to the function of the inverter 4bb at the timing of the falling edge of the noise voltage Va. That is, the logic level of the output of the latch circuit 4b changes at the timing of each of the rising and falling edges of the noise voltage Va. Thus, when the noise voltage Va is superimposed on the input digital signal VIN, the logic level of the output of each of the latch circuits 4a and 4b becomes high.

The output of each of the latch circuits 4a and 4b is supplied to the circuit 6. As shown in the left side of FIG. 7G, the logic level of the output of the NOR gate 6ab of the circuit 6 remains unchanged and is kept low at the timing of each of the rising and falling edges of the noise voltage Va. In contrast, as shown in the left side of FIG. 7H, the logic level of the output of the NOR gate 6bb of the circuit 6 changes from high to low at the timing of the rising edge of the noise voltage Va. Thus, the logic level of the output of each of the NOR gate 6ab and the NOR gate 6bb of the circuit 6 becomes low.

In this way, when the noise voltage Va is superimposed on the input digital signal VIN, the logic level of each output of the circuit 6 becomes low. The output holding circuit 5 serves as a reset-set flip-flop (RS-FF). Therefore, as shown in the left side of each of FIGS. 7I and 7J, the logic level of each of the output terminals OUT3 and OUT3B of the logic signal transmission circuit 120 remains unchanged.

Next, it is assumed that a common mode negative pulse noise voltage Vb is superimposed on the input digital signal VIN. For example, a peak-to-peak voltage of the noise voltage Vb can be 42 volts. As shown in the right side of FIG. 7A, the noise voltage Vb is inputted to the latch circuit 4a through the inverting buffer 2a and the capacitor 3a. Likewise, as shown in the right side of FIG. 7B, the noise voltage Vb is inputted to the latch circuit 4b through the non-inverting buffer 2b and the capacitor 3b.

As shown in the right side of FIG. 7C, the noise voltage Vb inputted to the capacitor 3a appears directly at the input of the latch circuit 4a so that the logic level can change according to a change in the noise voltage Vb. In contrast, even when the noise voltage Vb is inputted to the latch circuit 4b, the noise voltage Vb is regenerated back to a power circuit of the latch circuit 4b and thus clamped.

As shown in the right side of FIG. 7E, the logic level of the output of the latch circuit 4a changes from low to high at a timing of the falling edge of the noise voltage Vb. Further, the logic level of the output of the latch circuit 4a changes from high to low at a timing of the rising edge of the noise voltage Vb.

In contrast, even when the noise voltage Vb is superimposed, the noise voltage Vb is clamped at an input terminal of the latch circuit 4b. Therefore, the logic level of the output of the latch circuit 4b remains unchanged at the timing of the falling edge of the noise voltage Vb. Then, the logic level of the output of the latch circuit 4b changes from high to low at the timing of the rising edge of the noise voltage Vb. Thus, when the noise voltage Vb is superimposed on the input digital signal VIN, the logic level of the output of each of the latch circuits 4a and 4b becomes low.

The output of each of the latch circuits 4a and 4b is supplied to the circuit 6. As shown in the right side of FIG. 7G, the logic level of the output of the NOR gate 6ab of the circuit 6 remains unchanged and is kept low at the timing of each of the rising and falling edges of the noise voltage Vb. In contrast, as shown in the right side of FIG. 7H, the logic level of the output of the NOR gate 6bb of the circuit 6 changes from high to low at the timing of the falling edge of the noise voltage Vb. Thus, the logic level of the output of each of the NOR gate 6ab and the NOR gate 6bb of the circuit 6 becomes low. In this way, when the noise voltage Vb is superimposed on the input digital signal VIN, the logic level of each output of the circuit 6 becomes low. The output holding circuit 5 serves as a reset-set flip-flop (RS-FF). Therefore, as shown in the right side of each of FIGS. 7I and 7J, the logic level of each of the output terminals OUT3 and OUT3B of the logic signal transmission circuit 120 remains unchanged.

Thus, even when the common mode pulse noise voltages Va and Vb are superimposed during transmission of the logic signal through the logic signal transmission circuit 120, the common mode pulse noise voltages Va and Vb do not affect the logic levels of the output terminals OUT3 and OUT3B of the logic signal transmission circuit 120.

As described above, according to the third embodiment, when the common mode pulse noise voltages Va and Vb are superimposed on the input signal to the circuit 6, the logic level of each output of the circuit 6 becomes low so that the logic level of each input of the output holding circuit 5 can be low. In this case, since the output holding circuit 5 serves as a reset-set flip-flop (RS-FF), the logic level of each of the output terminals OUT3 and OUT3B of the logic signal transmission circuit 120 remains unchanged. Thus, the circuit 6 prevents the logic level of each input of the output holding circuit 5 from being low at the same time, thereby preventing a malfunction caused by common mode noise.

Fourth Embodiment

A logic signal transmission circuit 130 according to a fourth embodiment of the present disclosure is described below with reference to FIG. 8. A difference between the third embodiment and the fourth embodiment is as follows.

Figure 8:
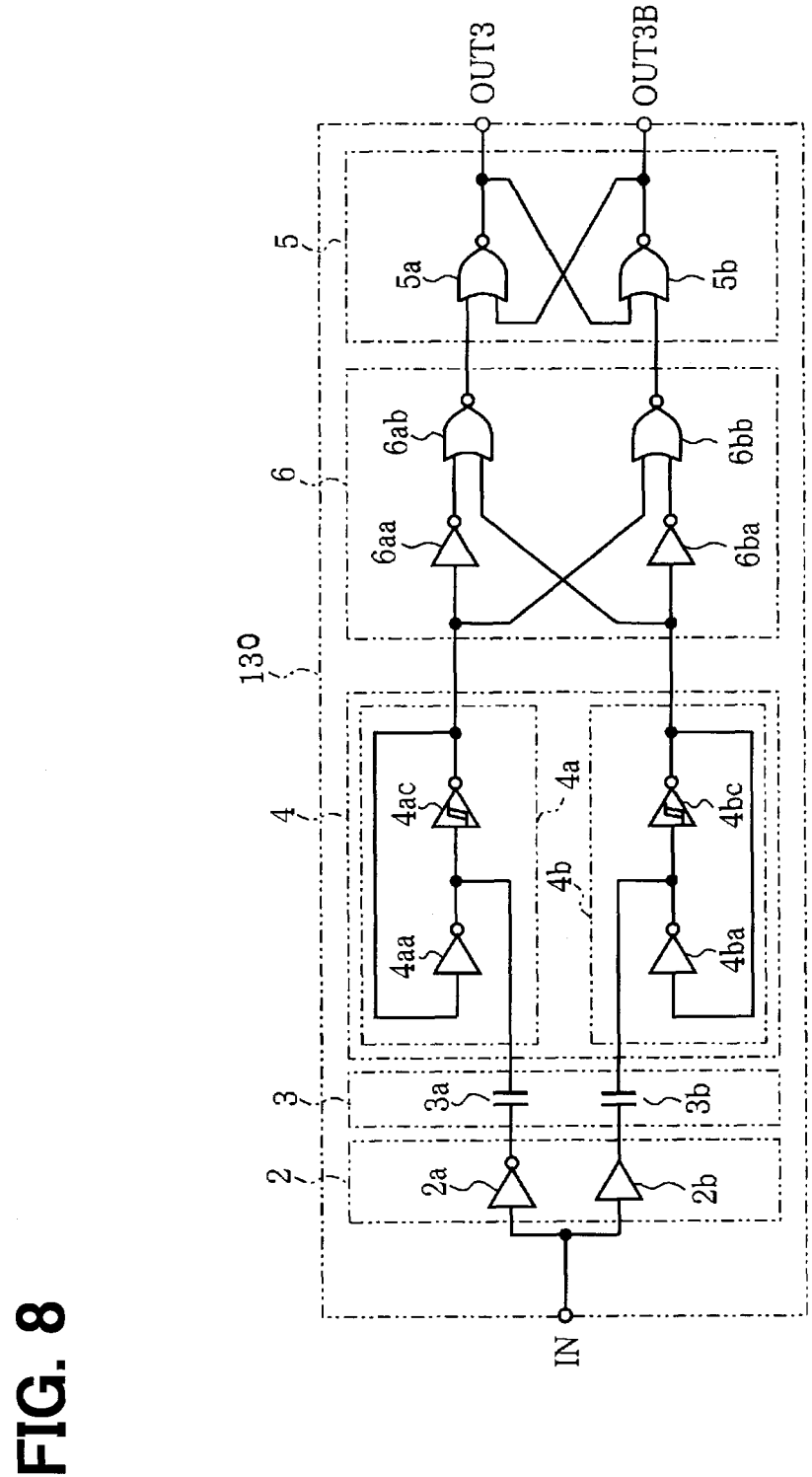
FIG. 8 is a diagram illustrating a logic signal transmission circuit according to a fourth embodiment of the present disclosure.

As shown in FIG. 8, in the logic signal transmission circuit 130 according to the fourth embodiment, the latch circuit 4a includes a Schmitt trigger inverter 4ac instead of the inverter 4ab, and the latch circuit 4b includes a Schmitt trigger inverter 4bc instead of the inverter 4bb. Thus, even when noise is superimposed on the input digital signal VIN, resistance to variation in the input digital signal is improved so that influence of the noise can be reduced.

Fifth Embodiment

A logic signal transmission circuit 140 according to a fifth embodiment of the present disclosure is described below with reference to FIG. 9. A difference between the third embodiment and the fifth embodiment is as follows.

Figure 9:
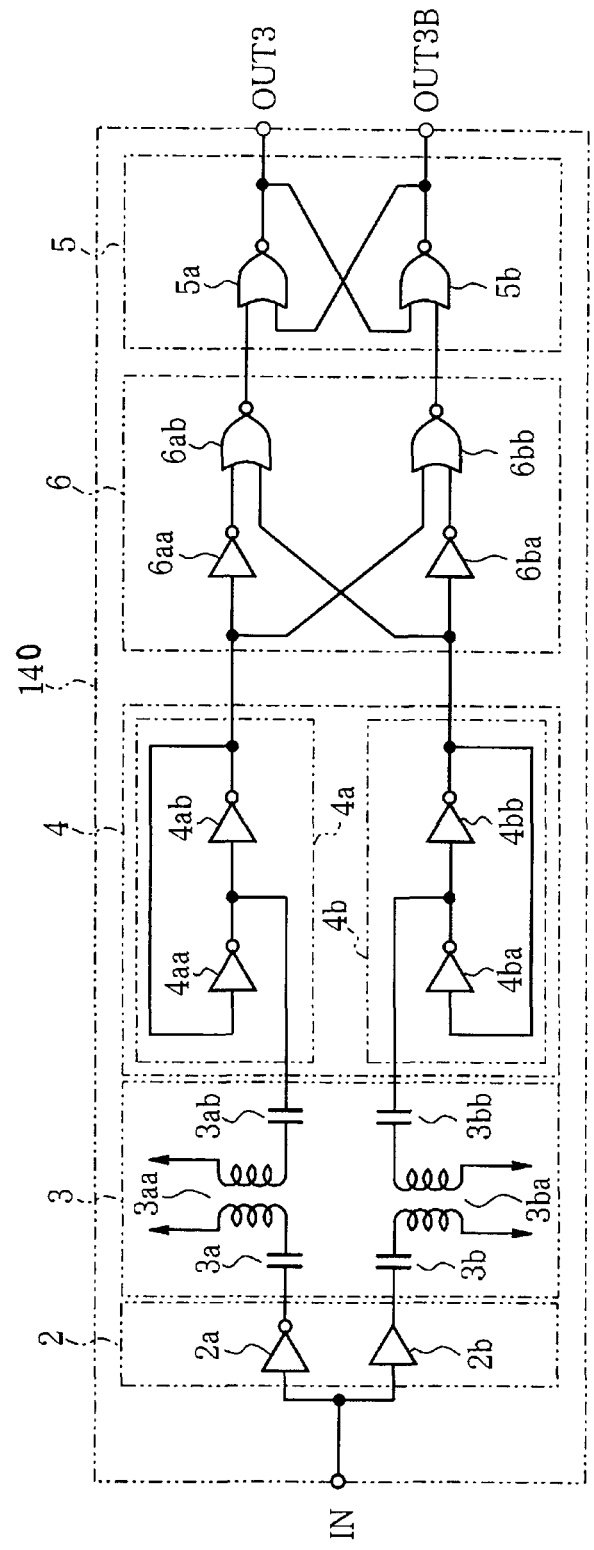
FIG. 9 is a diagram illustrating a logic signal transmission circuit according to a fifth embodiment of the present disclosure.

As shown in FIG. 9, in the logic signal transmission circuit 140 according to the fifth embodiment, the isolation section 3 includes a transformer 3aa and a capacitor 3ab. A primary side of the transformer 3aa is connected to the capacitor 3a, and a secondary side of the transformer 3aa is connected to the capacitor 3ab. The digital signal outputted from the inverting buffer 2a is inputted to the latch circuit 4a through the capacitor 3ab. The capacitor 3ab blocks direct current.

The isolation section 3 further includes a transformer 3ba and a capacitor 3bb. A primary side of the transformer 3ba is connected to the capacitor 3b, and a secondary side of the transformer 3ba is connected to the capacitor 3bb. The digital signal outputted from the non-inverting buffer 2b is inputted to the latch circuit 4b through the capacitor 3bb. The capacitor 3bb blocks direct current.

Even in such a structure, the same advantages as the third embodiment can be obtained.

Sixth Embodiment

A sixth embodiment of the present disclosure is described below with reference to FIGS. 10 and 11. A difference of the sixth embodiment from the preceding embodiments is as follows.

Figure 10:
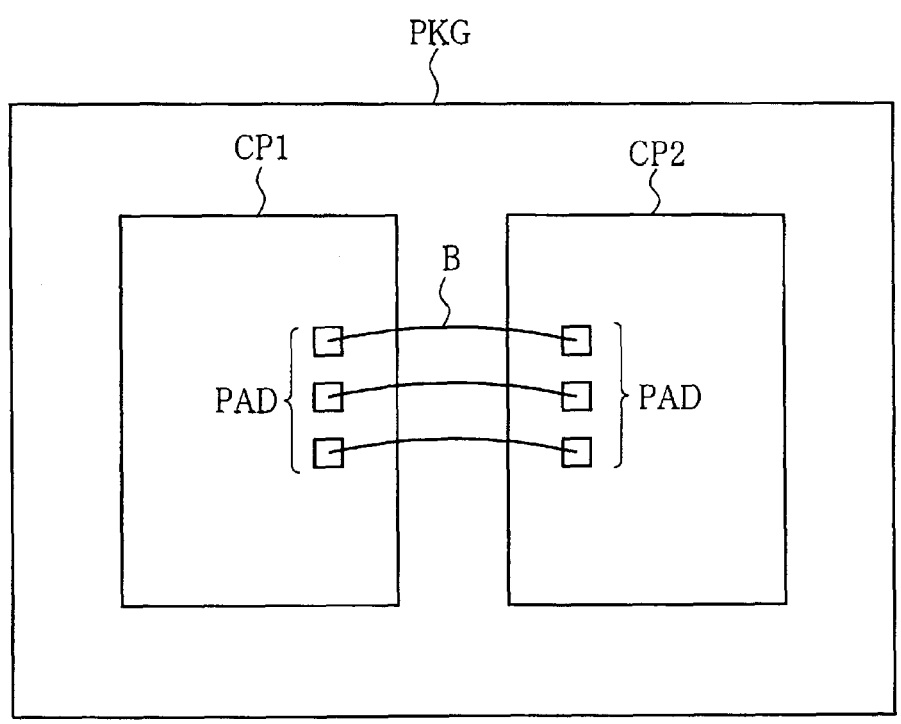
FIG. 10 is a diagram illustrating an internal structure of a package according to a sixth embodiment of the present disclosure.

FIG. 10 is a plan view illustrating an internal structure of a package PKG. A semiconductor chip CP1 and a semiconductor chip CP2 are incorporated in the package PKG. The semiconductor chip CP1 operates at a high voltage (e.g., from 645 volts to 650 volts). The semiconductor chip CP2 operates at a low voltage (e.g., from 0 volts to 5 volts). Bonding pads PAD of the semiconductor chip CP1 are connected through bonding wires B to bonding pads PAD of the semiconductor chip CP2.

Figure 11:
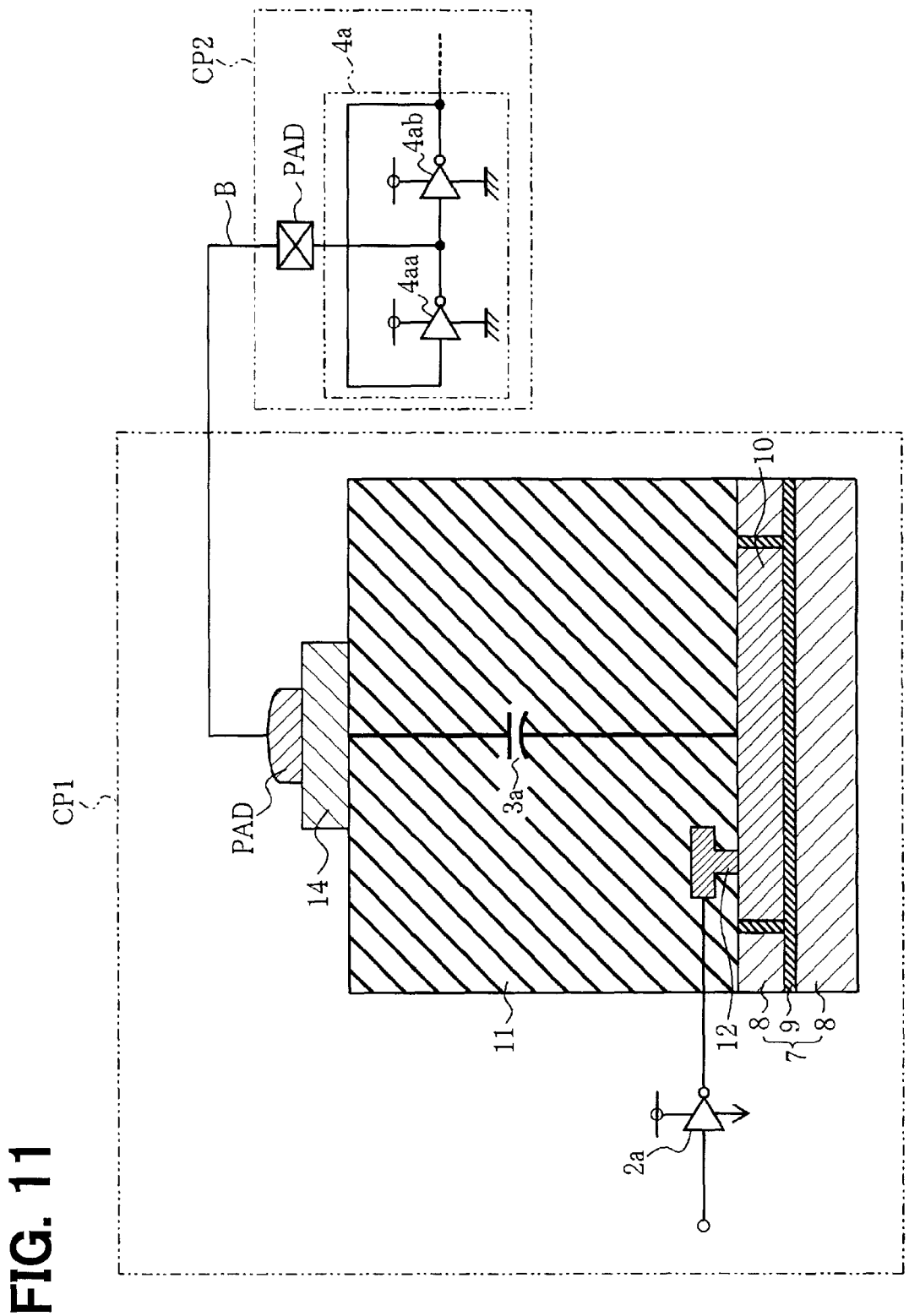
FIG. 11 is a diagram illustrating an electrical configuration in the package of FIG. 10.

FIG. 11 is a cross-sectional view of the capacitor 3a. A supporting substrate 7 is a silicon-on-insulator (SOI) substrate, for example, including two monocrystalline substrates 8 that are bonded together through an insulation layer 9. A conductive layer 10 is formed in the monocrystalline substrate 8 and isolated by trench isolation. The conductive layer 10 is a diffusion layer where impurities are injected and diffused. The conductive layer 10 corresponds to a first electrical conductor in claims.

An interlayer dielectric layer 11 is formed on the conductive layer 10. A wiring layer 12 made of conductive material is formed in the interlayer dielectric layer 11. The driving circuit 2 is formed in the semiconductor chip CP1. For example, the wiring layer 12 is connected to the output of the inverting buffer 2a of the driving circuit 2 so that the inverting buffer 2a can apply the digital signal to the conductive layer 10 through the wiring layer 12. A top wiring layer 14 and the bonding pad PAD are formed on the interlayer dielectric layer 11.

The top wiring layer 14 and the bonding pad PAD correspond to a second electrical conductor in claims. In this way, the capacitor 3a has a multilayer structure including the conductive layer 10, the interlayer dielectric layer 11, the top wiring layer 14, and the bonding pad PAD. The latch circuit 4a and the subsequent stage (e.g., the NOR gate 5a) are formed in the second semiconductor chip CP2. The bonding pad PAD of the semiconductor chip CP2 is electrically connected to the input of the latch circuit 4a.

It is noted that the non-inverting buffer 2b, the capacitor 3b, the latch circuit 4b, and the subsequent stage (e.g., the NOR gate 5b) can be configured in the same manner as described above for the inverting buffer 2a, the capacitor 3a, the latch circuit 4a, and the subsequent stage (e.g., the NOR gate 5a).

As described above, according to the sixth embodiment, the capacitor 3a includes the conductive layer 10, the top wiring layer 14, and the interlayer dielectric layer 11 sandwiched between the conductive layer 10 and the top wiring layer 14. Thus, the capacitor 3a can be formed in the semiconductor chip CP1.

The inverting buffer 2a of the driving circuit 2 is formed in the semiconductor chip CP1 where the capacitor 3a is formed. The latch circuit 4a is formed in the semiconductor chip CP2, which operates at a low voltage. The semiconductor chips CP1 and CP2 are connected to each other through the bonding wires B inside the package PKG. Thus, the logic signal transmission circuit according to the embodiments can be packaged in one package PKG.

In the sixth embodiment, the conductive layer 10 corresponds to a first electrical conductor in claims, and the top wiring layer 14 and the bonding pad PAD correspond to a second electrical conductor in claims. The first electrical conductor and the second electrical conductor can be made of electrical conductive material such as metal or semiconductor such as silicon.

Seventh Embodiment

A seventh embodiment of the present disclosure is described below with reference to FIG. 12. A difference of the seventh embodiment from the sixth embodiment is as follows.

Figure 12:
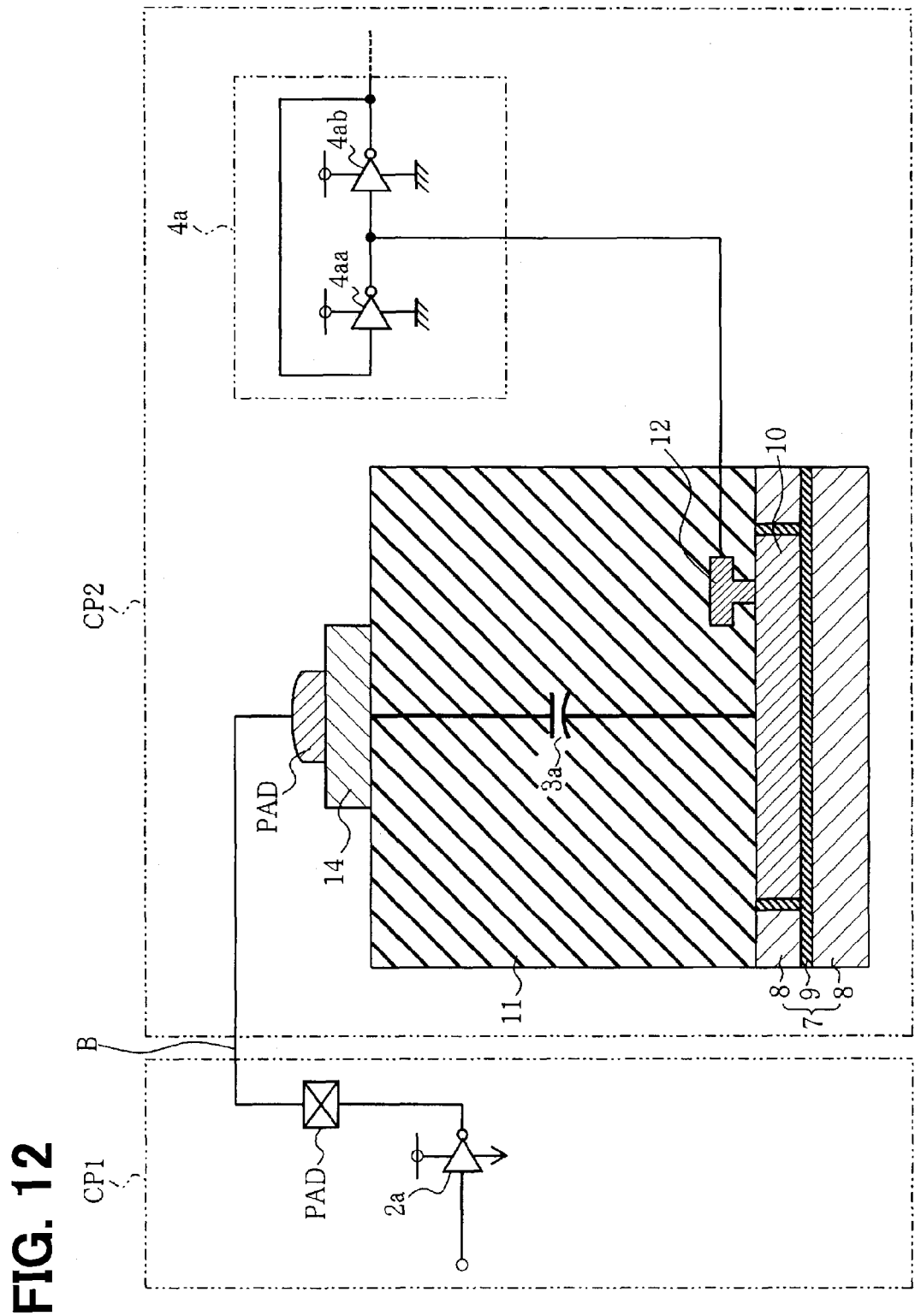
FIG. 12 is a diagram illustrating an electrical configuration in a package according to a seventh embodiment of the present disclosure.

FIG. 12 is a cross-sectional view of the capacitor 3a. The structure of the capacitor 3a shown in FIG. 12 is similar to the structure of the capacitor 3a shown in FIG. 11. The structure of the capacitor 3a shown in FIG. 12 differs in three points from the structure of the capacitor 3a shown in FIG. 11. Firstly, the capacitor 3a is formed in the semiconductor CP2, which operates at a low voltage. Secondary, the wiring layer 12 is connected to the input of the latch circuit 4a inside the semiconductor chip CP2. Thirdly, the bonding pads PAD of the semiconductor chip CP2 are connected through the bonding wires B to the bonding pads PAD of the semiconductor chip CP1, which operates at a high voltage.

Even in such a structure, since the capacitor 3a includes the conductive layer 10, the top wiring layer 14, and the interlayer dielectric layer 11 sandwiched between the conductive layer 10 and the top wiring layer 14, the capacitor 3a can be formed in the semiconductor chip CP2.

The latch circuit 4a is formed in the semiconductor chip CP2 where the capacitor 3a is formed. In contrast, the driving circuit 2 is formed in the semiconductor chip CP1. The semiconductor chips CP1 and CP2 are connected to each other through the bonding wires B inside the package PKG. Thus, the logic signal transmission circuits according to the embodiments can be packaged in one package.

Eighth Embodiment

A logic signal transmission circuit 150 according to an eighth embodiment of the present disclosure is described below with reference to FIG. 15. A difference of the eighth embodiment from the third embodiment is as follows.

According to the eighth embodiment, an output terminal of an odd numbered inverter of one of a pair of latch circuits of the latch section 4 is connected to an output terminal of an even numbered inverter of the other of the pair of latch circuits of the latch section 4 to form an input terminal of the one of the pair of latch circuits of the latch section 4. Further, an output terminal of an even numbered inverter of the one of the pair of latch circuits of the latch section 4 is connected to an output terminal of an odd numbered inverter of the other of the pair of latch circuits of the latch section 4 to form an input terminal of the other of the pair of latch circuits of the latch section 4.

Figure 13:
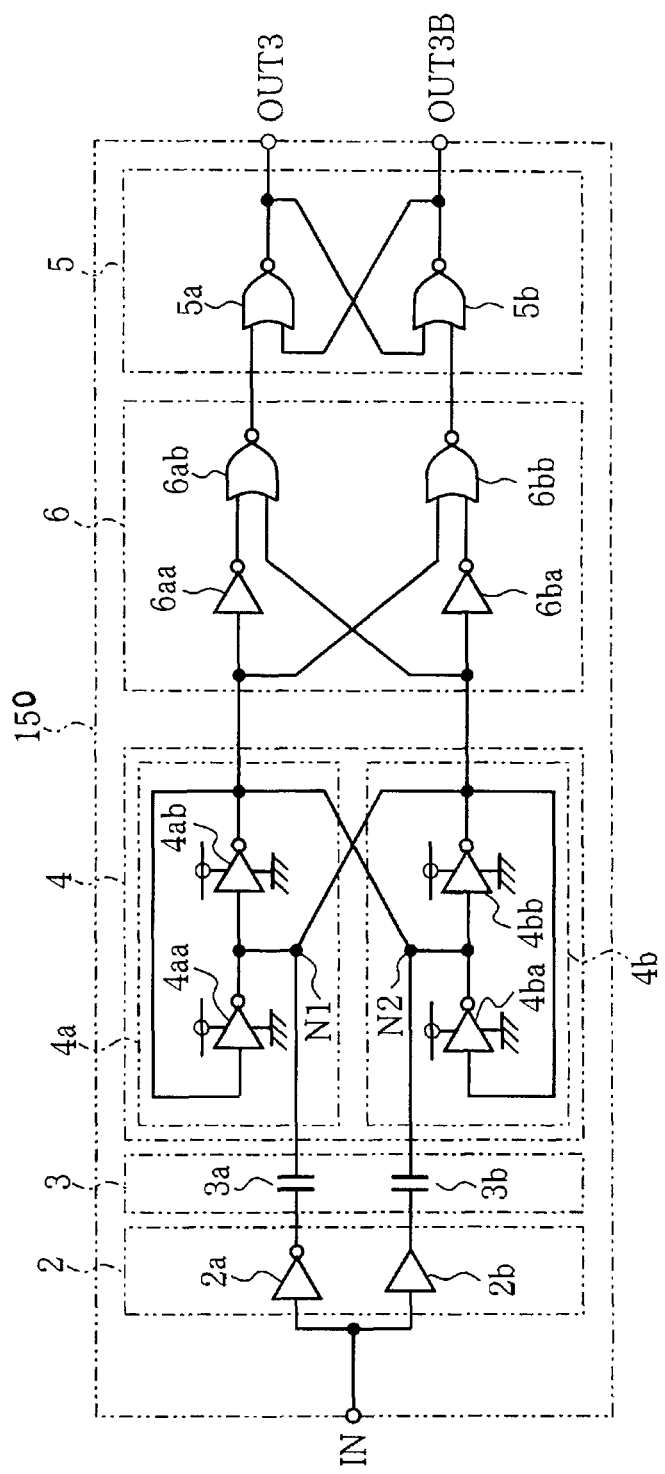
FIG. 13 is a diagram illustrating a logic signal transmission circuit according to an eighth embodiment of the present disclosure.

Specifically, as shown in FIG. 13, according to the eighth embodiment, a node N1 between the output of the odd numbered inverter 4aa of the latch circuit 4a and the output of the capacitor 3a is connected to the output of the even numbered inverter 4bb of the latch circuit 4b. The node N1 serves as an input terminal of the latch circuit 4a. Further, a node N2 between the output of the inverter 4ba of the latch circuit 4a and the output of the capacitor 3b is connected to the output of the inverter 4ab of the latch circuit 4a. The node N2 serves as an input terminal of the latch circuit 4b.

In a circuit configuration, the inverters 4aa and 4ab are in a steady state when the logic levels of the outputs of the inverters 4aa and 4ab are opposite. Likewise, the inverters 4ba and 4bb are in a steady state when the logic levels of the outputs of the inverters 4ba and 4bb are opposite. Therefore, the inverters 4aa and 4bb are in a steady state when the logic levels of the outputs of the inverters 4aa and 4bb are the same, and the inverters 4ab and 4ba are in a steady state when the logic levels of the outputs of the inverters 4ab and 4ba are the same.

When the first digital signal of the differential signal pair is inputted through the capacitor 3a to the node N1, the first digital signal is inputted to each of the inverter 4ab and the inverter 4ba. When the second digital signal of the differential signal pair is inputted through the capacitor 3b to the node N2, the second digital signal is inputted to each of the inverter 4bb and the inverter 4aa.

That is, while the first digital signal of the differential signal pair is inputted to the inverter 4ab and the inverter 4ba at the same time, the second digital signal of the differential signal pair is inputted to the inverter 4aa and the inverter 4bb at the same time. Therefore, it is likely that the differential signal pair changes across the threshold voltage Vref of the latch section 4. In other words, the change in the logic level of the latch circuit 4a has an influence on the change in the logic level of the latch circuit 4b, and the change in the logic level of the latch circuit 4b has an influence on the change in the logic level of the latch circuit 4a. Thus, it is likely that the logic levels of the outputs of the inverters 4aa, 4ab, 4ba, and 4bb change.

Modifications

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

According to the embodiments, each of the latch circuits 4a and 4b has two inverters connected in a loop. The number of inverters included in each of the latch circuit 4a and 4b is not limited to two, as long as the number is even number.

A clamp circuit constructed with a Zener diode can be connected to the gate of each of the MOS transistors M1-M4. Other types of transistors can be used instead of the MOS transistors M1-M4.

What is claimed is:

1. A logic signal transmission circuit comprising:
    a driving circuit configured to convert an input digital signal to a differential signal pair having a first digital signal and a second digital signal;
    an isolation section configured to block direct current and to pass the differential signal pair, the isolation section including a first isolation barrier and a second isolation barrier, the first isolation barrier configured to pass the first digital signal, the second isolation barrier configured to pass the second digital signal; and
    a latch section including a first latch circuit connected to an output terminal of the first isolation barrier and a second latch circuit connected to an output terminal of the second isolation barrier, wherein
    the first latch circuit has even numbers of first inverters which are connected in a first loop and configured to output a first logic signal by turning ON and OFF a power supply voltage in a complementary manner,
    a first input impedance of the first latch circuit is set so that when a logic level of the first digital signal changes, a first transient voltage inputted through the first isolation barrier to the first latch circuit changes across a first threshold voltage of the first latch circuit,
    when the first transient voltage changes across the first threshold voltage, a logic level of the first logic signal changes,
    the second latch circuit has even numbers of second inverters which are connected in a second loop and configured to output a second logic signal by turning ON and OFF a power supply voltage in a complementary manner,
    a second input impedance of the second latch circuit is set so that when a logic level of the second digital signal changes, a second transient voltage inputted through the second isolation barrier to the second latch circuit changes across a second threshold of the second latch circuit, and
    when the second transient voltage changes across the second threshold voltage, a logic level of the second logic signal changes.

2. The logic signal transmission circuit according to claim 1, wherein
    the first input impedance of the first latch circuit is formed by connecting a first resistor to the first inverters, and
    the second input impedance of the second latch circuit is formed by connecting a second resistor to the second inverters.

3. The logic signal transmission circuit according to claim 1, wherein
    the first inverters of the first latch circuit are constructed with first transistors,
    the first input impedance of the first latch circuit is formed by an internal resistance of at least one of the first transistors,
    the second inverters of the second latch circuit are constructed with second transistors, and
    the second input impedance of the second latch circuit is formed by an internal resistance of at least one of the second transistors.

4. The logic signal transmission circuit according to claim 1, wherein
    an output terminal of an odd numbered inverter of the first inverters of the first latch circuit is connected to an output terminal of an even numbered inverter of the second inverters of the second latch circuit to form an input terminal of the first latch circuit, and
    an output terminal of an even numbered inverter of the first inverters of the first latch circuit is connected to an output terminal of an odd numbered inverter of the second inverters of the second latch circuit to form an input terminal of the second latch circuit.

5. The logic signal transmission circuit according to claim 1, further comprising:
a first circuit including a first NOT gate, a second NOT gate, a first NOR gate, and a second NOR gate; and
a second circuit including a RS flip-flop connected to an output terminal of the first circuit to hold an output of the first circuit, wherein
a series circuit of the first NOT gate and the first NOR gate is connected to an output terminal of the first latch circuit,
the output terminal of the first latch circuit is connected to an input terminal of the second NOR gate,
a series circuit of the second NOT gate and the second NOR gate is connected to an output terminal of the second latch circuit, and
the output terminal of the second latch circuit is connected to an input terminal of the first NOR gate.

6. The logic signal transmission circuit according to claim 1, further comprising:
an output holding circuit configured to hold an output of the latch section.

7. The logic signal transmission circuit according to claim 1, wherein
each of the first inverters of the first latch circuit and the second inverters of the second latch circuit is a Schmitt trigger inverter.

8. The logic signal transmission circuit according to claim 1, wherein
the isolation section includes a transformer configured to pass the differential signal pair.

9. The logic signal transmission circuit according claim 1, wherein
the isolation section includes a capacitor, and
the capacitor has a first electrical conductor, a second electrical conductor, and an electrical insulator sandwiched between the first electrical conductor and the second electrical conductor.

10. The logic signal transmission circuit according to claim 9, wherein
the second electrical conductor has a bonding pad,
an output terminal of the driving circuit is electrically connected to the first electrical conductor, and
an input terminal of the latch section is connected to the bonding pad through a bonding wire.

11. The logic signal transmission circuit according to claim 10, wherein
the driving circuit and the capacitor are implemented on a first semiconductor chip,
the latch section is implemented on a second semiconductor chip different from the first semiconductor chip, and
the first semiconductor chip and the semiconductor chip are packaged in a common package and connected together through the bonding wire inside the package.

12. The logic signal transmission circuit according to claim 9, wherein
the second electrical conductor has a bonding pad,
an output terminal of the driving circuit is connected to the bonding pad through a bonding wire, and
an input terminal of the latch section is electrically connected to the first electrical conductor.

13. The logic signal transmission circuit according to claim 12, wherein
the driving circuit is implemented on a first semiconductor chip,
the capacitor and the latch section are implemented on a second semiconductor chip different from the first semiconductor chip, and
the first semiconductor chip and the semiconductor chip are packaged in a common package and connected together through the bonding wire inside the package.

14. The logic signal transmission circuit according to claim 9, wherein
each of the first input impedance and the second input impedance of the latch section is adjusted according to a capacitance of the capacitor.

15. The logic signal transmission circuit according to claim 9, wherein
each of the first electrical conductor and the second electrical conductor is made of metal or silicon.

\* \* \* \* \*